(12) United States Patent
Inamori et al.

(10) Patent No.: US 9,888,583 B2
(45) Date of Patent: Feb. 6, 2018

(54) FLEXIBLE PRINTED CIRCUIT BOARD

(71) Applicant: MINEBEA CO., LTD., Nagano (JP)

(72) Inventors: Dohaku Inamori, Saku (JP); Takashi Kashino, Saku (JP)

(73) Assignee: MINEBEA CO., LTD., Kitasaku-gun (JP)

( * ) Notice: Subject to any disclaimer, the term of this patent is extended or adjusted under 35 U.S.C. 154(b) by 0 days.

(21) Appl. No.: 14/815,413

(22) Filed: Jul. 31, 2015

(65) Prior Publication Data
US 2016/0037638 A1     Feb. 4, 2016

(30) Foreign Application Priority Data
Aug. 4, 2014 (JP) ................. 2014-159097

(51) Int. Cl.
  *H05K 1/00*   (2006.01)
  *H05K 3/36*   (2006.01)
  *H05K 1/14*   (2006.01)
  *H05K 1/11*   (2006.01)

(52) U.S. Cl.
  CPC ............ *H05K 3/363* (2013.01); *H05K 1/147* (2013.01); *H05K 1/113* (2013.01); *H05K 1/118* (2013.01); *H05K 2201/09036* (2013.01); *H05K 2201/0969* (2013.01); *H05K 2201/09745* (2013.01); *H05K 2203/1178* (2013.01)

(58) Field of Classification Search
  CPC .......... H05K 1/116; H05K 1/251; H05K 3/40; H05K 3/42; H01L 21/02; H01L 21/44; H01L 21/70; H01L 23/48; H01L 23/485
  USPC ................ 174/254, 250; 257/737, 754, 774; 333/185; 438/254, 613
  See application file for complete search history.

(56) References Cited

U.S. PATENT DOCUMENTS

| | | | | |
|---|---|---|---|---|
| 4,150,177 A * | 4/1979 | Guditz | ............... | H01L 21/4846 205/187 |
| 4,978,639 A * | 12/1990 | Hua | .................. | H01L 21/288 148/DIG. 135 |
| 5,266,446 A * | 11/1993 | Chang | .................. | H01L 21/481 216/13 |
| 6,544,841 B1 * | 4/2003 | Ciavatti | ............ | H01L 27/10852 257/308 |
| 8,525,332 B2 * | 9/2013 | Matsumoto | ......... | H01L 23/3157 257/737 |
| 8,703,274 B2 * | 4/2014 | Budd | .................. | B23K 1/0016 428/156 |

(Continued)

FOREIGN PATENT DOCUMENTS

| | | |
|---|---|---|
| JP | H05-29178 U | 4/1993 |
| JP | H07-45923 A | 2/1995 |

(Continued)

OTHER PUBLICATIONS

Apr. 25, 2017 Office Action issued in Japanese Patent Application No. 2014-159097.

*Primary Examiner* — Xiaoliang Chen
(74) *Attorney, Agent, or Firm* — Oliff PLC

(57) ABSTRACT

There is provided a flexible printed circuit board. The flexible printed circuit board includes: a flexible insulation layer having a first surface and a second surface; a first land which is conductive and which is provided on the first surface of the flexible insulation layer; and a conductive member which is provided on the second surface of the flexible insulation layer. A recess is formed on the first land.

11 Claims, 6 Drawing Sheets

(56) References Cited

U.S. PATENT DOCUMENTS

| | | | | |
|---|---|---|---|---|
| 2001/0015285 A1* | 8/2001 | Nakayama | ........ | H01L 23/49816 |
| | | | | 174/250 |
| 2001/0023988 A1* | 9/2001 | Hatano | ............. | H01L 23/53238 |
| | | | | 257/754 |
| 2001/0040289 A1* | 11/2001 | Kobayashi | .............. | H01L 24/11 |
| | | | | 257/737 |
| 2011/0049707 A1* | 3/2011 | Seto | ........................ | H01L 24/11 |
| | | | | 257/737 |
| 2011/0121462 A1* | 5/2011 | Kim | ...................... | H01L 21/563 |
| | | | | 257/774 |
| 2014/0077896 A1* | 3/2014 | Lee | .......................... | H03H 7/17 |
| | | | | 333/185 |
| 2014/0162449 A1* | 6/2014 | An | ..................... | H01L 21/76885 |
| | | | | 438/613 |

FOREIGN PATENT DOCUMENTS

| | | |
|---|---|---|
| JP | 2005-197282 A | 7/2005 |
| JP | 2006-303354 A | 11/2006 |

* cited by examiner

FLEXIBLE PRINTED CIRCUIT BOARD

CROSS REFERENCE TO RELATED APPLICATION

The present application claims priority from Japanese Patent Application No. 2014-159097 filed on Aug. 4, 2014, and titled "FLEXIBLE PRINTED CIRCUIT BOARD", the disclosure of which is incorporated herein by reference in its entirety.

BACKGROUND OF THE INVENTION

Field of the Invention

The present teaching relates to a flexible printed circuit board which can be electrically connected to a counterpart electrode reliably.

Description of the Related Art

For example, a strain gage measuring the strain or distortion of a structure is formed in one flexible printed circuit board (a first flexible printed circuit board) which is very thin. In order to extract or take out the output from the strain gage, another flexible printed circuit board (a second flexible printed circuit board) for transmitting a signal is joined to the first flexible printed circuit board with soldering so that the electrode of the first flexible printed circuit board is electrically connected to the counterpart electrode of the second flexible printed circuit board.

The technology for joining the electrode of the first flexible printed circuit board to the counterpart electrode of the second flexible printed circuit board with soldering is generally known and is disclosed, for example, in Japanese Patent Application Laid-open No. 2006-303354 and Japanese Utility Model Publication No. H5-29178.

SUMMARY

The lands of solder joints of the flexible printed circuit boards described in Japanese Patent Application Laid-open No. 2006-303354 and Japanese Utility Model Publication No. H5-29178 have no special structure for allowing air to escape outside at the time of thermocompression bonding. Thus, air could remain in the solder joints at the time of thermocompression bonding and cause the detachment or exfoliation of the solder joints. Specifically, when pre-solder (pre-tin) is melted so that the through holes are filled with the pre-solder, the air in the through holes is not allowed to escape. This forms a layer of air between copper foil and solder to cause the detachment or exfoliation of the solder joints.

An object of the present teaching is to provide a flexible printed circuit board having an electrode, which is connected or joined to a counterpart electrode via a solder joint with sufficient strength so as to provide satisfactory conductivity for a long time.

According to a first aspect related to the present teaching, there is provided a flexible printed circuit board including: a flexible insulation layer having a first surface and a second surface; a first land which is conductive and which is provided on the first surface of the flexible insulation layer; and a conductive member which is provided on the second surface of the flexible insulation layer, wherein a recess is formed on the first land.

According to a second aspect related to the present teaching, there is provided a flexible printed circuit board including: an insulation layer which has a first surface and a second surface, and through which an through hole connecting the first surface and the second surface are formed, a metallic first land provided around an opening, on the first surface of the insulation layer, defined by the through hole; a metallic second land provided around an opening, on the second surface of the insulation layer, defined by the through hole; a metallic connecting portion provided in the through hole to connect the first land and the second land, wherein a channel which connects the through hole and an outside of the first land are formed at a position lower than a top of the first land.

DESCRIPTION OF THE EMBODIMENTS

Figure 1:
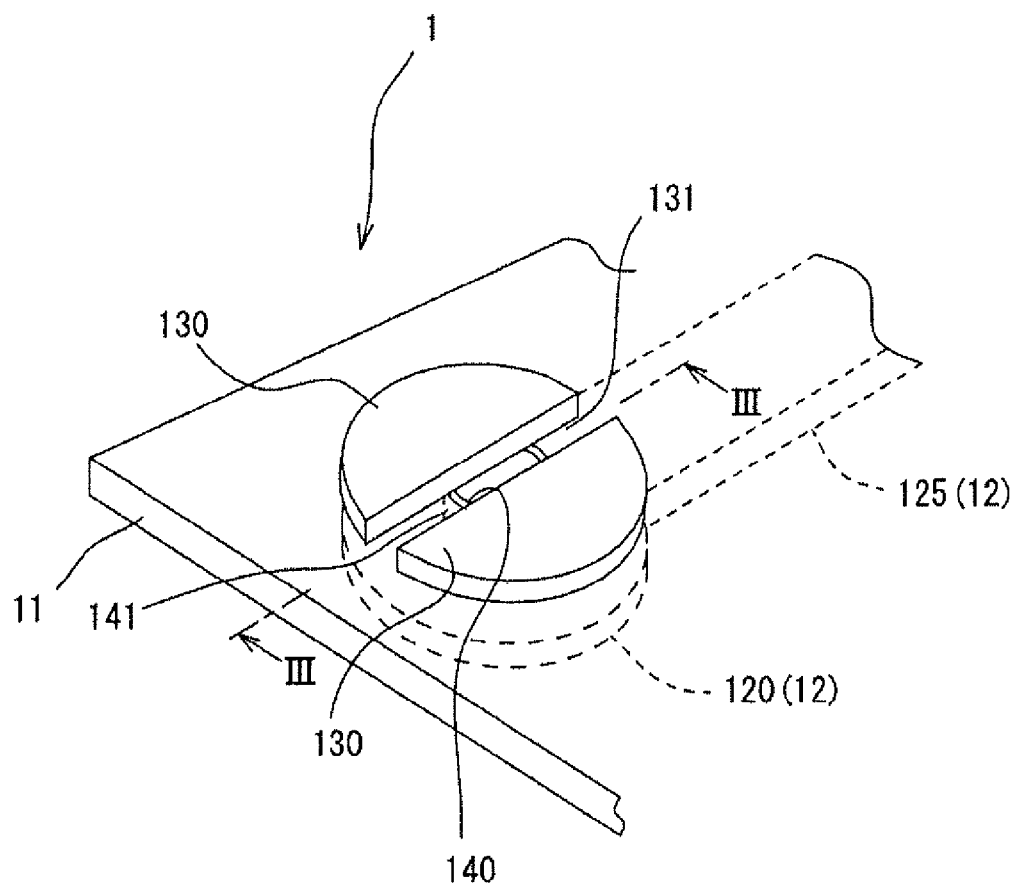
FIG. 1 is a perspective view of a flexible printed circuit board related to an embodiment of the present teaching as viewed from the side of one of lands provided in the flexible printed circuit board.
Figure 2:
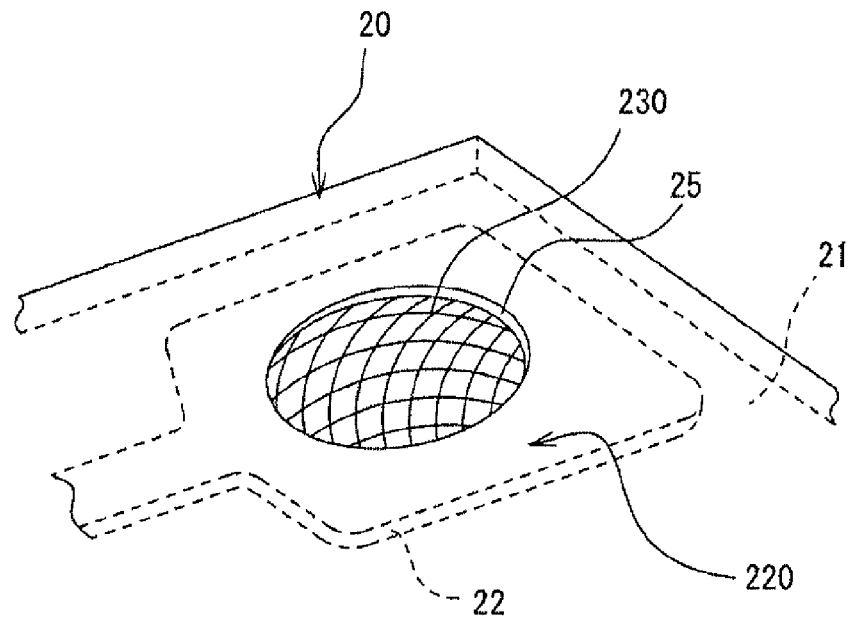
FIG. 2 is a perspective view depicting a counterpart electrode to be connected to the flexible printed circuit board depicted in FIG. 1 with soldering.
Figure 3:
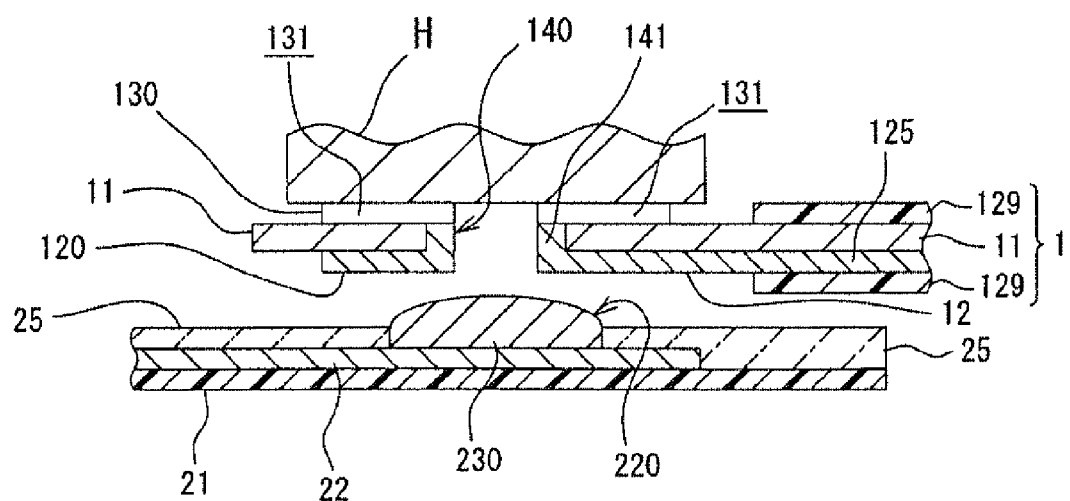
FIG. 3 is an illustrative view of a welding process depicting the cross-section taken along the line in FIG. 1 and depicting a state immediately before the electrode of the flexible printed circuit board depicted in FIG. 1 is joined or connected to the counterpart electrode depicted in FIG. 2 with soldering.
Figure 4:
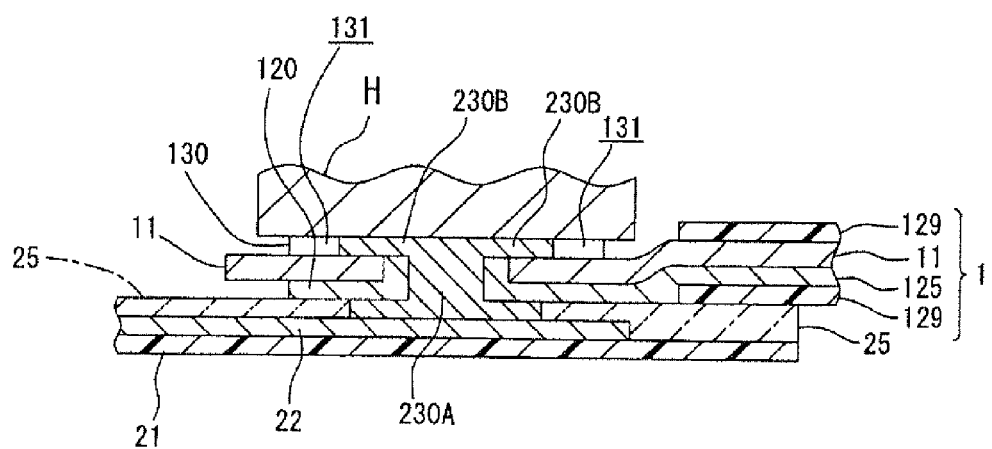
FIG. 4 is an illustrative view of the welding process depicting a state, subsequent to the state depicted in FIG. 3, in which the flexible printed circuit board depicted in FIG. 1 is completely pressed against the counterpart electrode with a pulse heater.

In the following, an explanation will be made with reference to the drawings about a flexible printed circuit board 1 related to an embodiment of the present teaching. FIG. 1 is a perspective view of the flexible printed circuit board 1 related to the embodiment of the present teaching as viewed from the side of one of lands (heating side land 130) of an electrode provided in the flexible printed circuit board 1. FIG. 2 is a perspective view depicting a counterpart electrode to be connected to the flexible printed circuit board 1 depicted in FIG. 1 with soldering. FIGS. 3 and 4 are illustrative views chronologically illustrating states that the flexible printed circuit board 1 related to this embodiment is crimped or pressure welded to a part of another flexible printed circuit board having the counterpart electrode through thermocompression bonding.

In the drawings, the sizes, thicknesses, and dimensions of components or parts related to the embodiment and modified embodiments are depicted exaggeratedly for easy understanding of the present teaching.

As depicted in FIGS. 3 and 4, the flexible printed circuit board 1 related to this embodiment includes a flexible insulation layer 11, a heating side land 130, and a conductor pattern 12. The insulation layer 11 is made of polyimide (PI). The heating side land 130 (a first land) is formed on the upper surface (one surface) (a first surface) of the insulation layer 11. The conductor pattern 12 is formed on the lower surface (the other surface) (a second surface) of the insulation layer 11. The conductor pattern 12 is electrically connected with the heating side land 130 via a through hole 140. The conductor pattern 12 is made of rolled copper foil and includes a welding side land 120, a thin wire pattern for electrical connection 125 (wiring), and an insulating coating 129. The welding side land 120 has a circular or annular shape. The thin wire pattern for electrical connection 125 extends from the welding side land 120 along the insulation layer 11. The insulating coating 129 covers the entire flexible printed circuit board 1 except for the welding side land 120 and the part, of the thin wire pattern for electrical connection 125, required for electrical connection with the counterpart electrode.

Figure 6A:
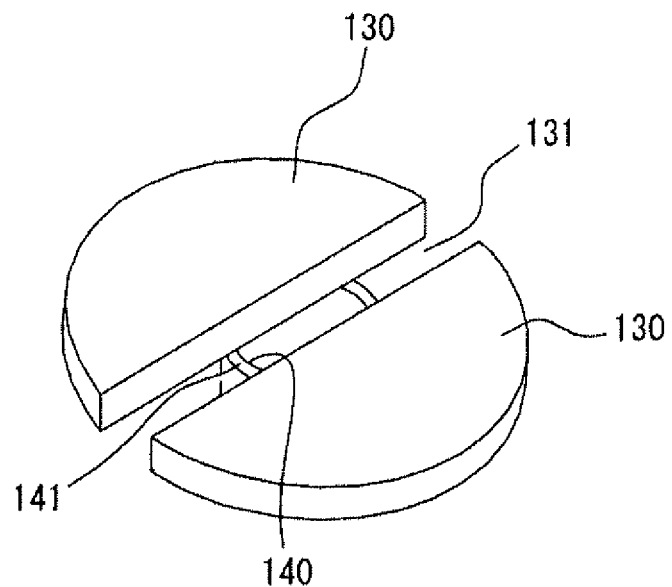
FIG. 6A is a perspective view of the shape of the land related to the embodiment of the present teaching.

As depicted in FIGS. 1 and 6A, the heating side land 130 has a circular plate shape or disk shape in plan view (hereinafter referred to as "disk"). The heating side land 130 is composed of two pieces of rolled copper foil and a groove 131 (slit). The two pieces of rolled copper foil are disposed to face each other with a small space intervening therebetween, and each piece has a substantially semicircular shape in plan view (hereinafter referred to as "semicircular plate"). The groove 131 is sandwiched by the two pieces of rolled copper foil. That is, the groove 131 is formed as one exemplary aspect of a recess of the heating side land 130 (The groove 131 is an example of recess formed in the land related to the present teaching). The heating side land 130 is formed on the upper surface of the insulation layer 11 to be concentric, in plan view, with the welding side land 120. The heating side land 130 is electrically connected with the welding side land 120 via a rolled copper foil 141 covering the inner circumferential surface of the through hole 140. That is, the heating side land 130 and the welding side land 120 are electrically and thermally connected with each other via the rolled copper foil 141 (a metallic connecting portion) in the through hole 140. Note that, in this specification, the expression of "thermally connected" mean a state that objects are connected with a metallic material, such as copper, having good thermal conductivity.

Subsequently, an explanation will be made about a structure of a counterpart electrode 220 to which the flexible printed circuit board 1 is connected. In this embodiment, the counterpart electrode 220 depicted in FIG. 2 is provided at an end of a flexible printed circuit board 20 having a strain gage (not depicted in FIG. 2). The end of the flexible printed circuit board 20 includes a base 21, a gage side conductor pattern 22, pre-solder 230, and a cover glass 25. The gage side conductor pattern 22 is provided on the upper surface of the base 21 and it is made of rolled copper foil. The pre-solder 230 is provided on a wide surface of an end of the gage side conductor pattern 22 to rise or bulge slightly. The cover glass 25 covers the base 21, except for a portion at which the pre-solder 230 is formed to rise or bulge, in order to protect the gage side conductor pattern 22.

Subsequently, an explanation will be given about a process for bonding the pre-solder 230 on the gage side conductor pattern 22 to the welding side land 120 of the flexible printed circuit board 1 with thermalcompression-bonding. FIGS. 3 and 4 are illustrative views of a welding process. FIG. 3 depicts a state immediately before the electrode of the flexible printed circuit board 1 is joined or connected to the counterpart electrode 220 with soldering by the cross-section taken along the line in FIG. 1. FIG. 4 depicts a state subsequent to the state depicted in FIG. 3, that is the state in which the flexible printed circuit board 1 is completely pressed against the counterpart electrode 220 with a pulse heater H.

When the welding side land 120 of the flexible printed circuit board 1 is welded to the counterpart electrode 220 via soldering, first, the lower side opening (the opening defined on the lower surface of the insulation layer 11) of the through hole 140 of the flexible printed circuit board 1 is allowed to approach the upper part of the pre-solder 230 on the counterpart electrode 220 of the gage side conductor pattern 22, and positional adjustment thereof is performed, as depicted in FIG. 3. Next, the pulse heater H is moved downward in a state that the lower surface (a heating surface) thereof is pressed against the upper surface (a contact surface) of the heating side land 130 of the flexible printed circuit board 1. Pressing the pulse heater H against the upper surface of the heating side land 130 allows the heat of the pulse heater H to be conducted to the welding side land 120 of the flexible printed circuit board 1 via the rolled copper foil 141 covering the inner circumferential surface of the through hole 140. Subsequently, when the pulse heater H is moved downward further, a part of the welding side land 120 around the lower side opening of the flexible printed circuit board 1 comes into contact with the pre-solder 230 and then it is pressed against thereto. This allows the heat from the pulse heater H to be conducted to the pre-solder 230 so as to melt the pre-solder 230.

As depicted in FIG. 4, a part of melted solder 230A moves upward through the through hole 140 such that the through hole 140 is filled with the melted solder without void or cavity. In this situation, air in a space defined by the upper surface of the pre-solder 230, the lower surface of the pulse heater H, and the inner circumferential surface of the through hole 140 is allowed to escape to the outside of the heating side land 130 (released to the outside of the heating side land 130) via the groove 131 of the heating side land 130 as the melted solder 230A moves upward. After the melted solder 230A has reached the lower surface of the pulse heater H, an excess solder 230B flows into the groove 131 of the heating side land 130 through the upper side opening (the opening defined on the upper surface of the insulation layer 11) of the thorough hole 140.

Next, the pulse heater H is moved away from the heating side land 130 to cool the melted solder 230A (including the excess solder 230B flowed into the groove 131). Then, cooled solder is securely fixed to the welding side land 120, the inner circumferential surface of the through hole 140, and a part of or entire groove 131 of the heating side land 130, of the flexible printed circuit board 1, and the counterpart electrode 220 of the gage side conductor pattern 22. This results in the reliable electrical connection between the welding side land 120 and the counterpart electrode 220 of the gage side conductor pattern 22.

Conventionally, there has been the following problem. That is, air in the space defined by the upper surface of the pre-solder, the lower surface of the pulse heater, and the inner circumferential surface of the through hole remains therein during the welding of pre-solder by the aid of the heat from the pulse heater. Thus, a layer of air is formed between the solder and the counterpart electrode of the gage side conductor pattern and/or between the solder and the inner circumferential surface of the through hole. As a result, any failure of solder welding are caused, and consequently the conduction failure between the welding side land of one of the flexible printed circuit boards and the counterpart electrode of the other of the flexible printed circuit boards are caused. In this embodiment, however, since the flexible printed circuit board 1 has the above structure or configuration, the air in the space does not remain between the solder and the parts to which the solder is welded and the above problem can be avoided.

Figure 7:
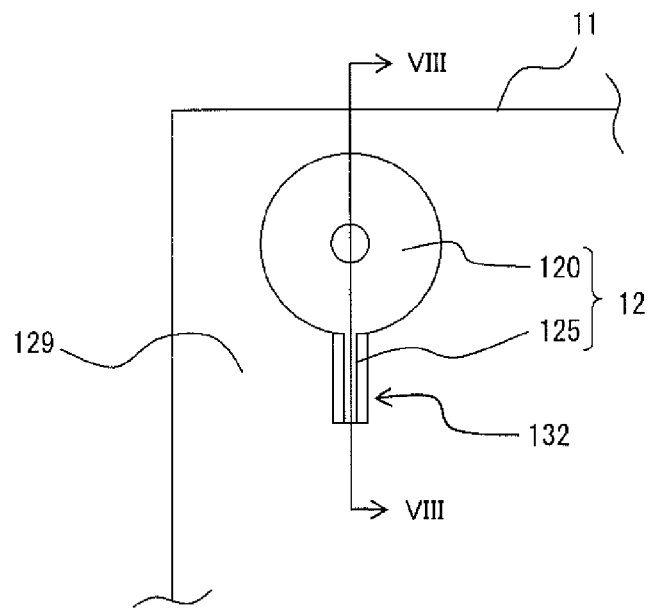
FIG. 7 is a bottom view of a flexible printed circuit board related to a modified embodiment of the present teaching.
Figure 8:
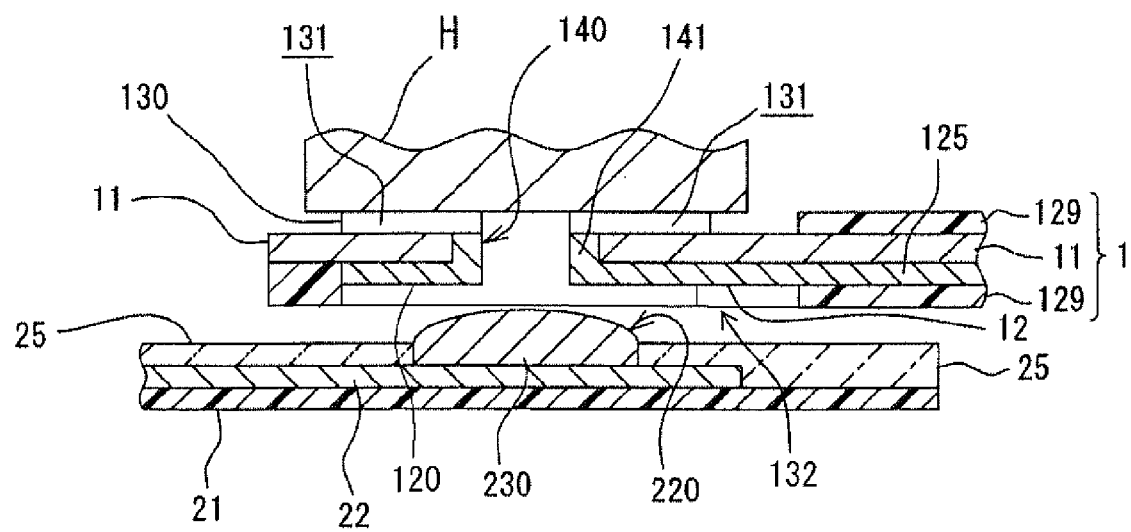
FIG. 8 is a cross-sectional view taken along the line VIII-VIII in FIG. 7.

In addition to the above embodiment, as depicted in FIGS. 7 and 8, a portion of the thin wire pattern for electrical connection 125 (wiring) which is formed on the other surface of the flexible insulation layer 11 and which is connected to the welding side land 120 may not be covered with the insulation coating (resist) 129, the portion having certain length and being defined adjacent to the welding side land 120. The area which is not covered with the insulation coating 129 (the recess which is obtained by the lack of the insulation coating 129 and has the depth corresponding to the thickness of the insulation coating 129) may be used as a solder relief part (solder escape part) 132. When such solder relief part 132 is provided, a part of excess solder flows into not only the groove 131 of the heating side land 130 of the flexible printed circuit board 1 as described above but also the solder relief part 132, during the process in which the pre-solder 230 is melted by the pulse heater H. Accordingly, air is more reliably prevented from accumulating between the solder and the parts to which the solder is welded.

Figure 5:
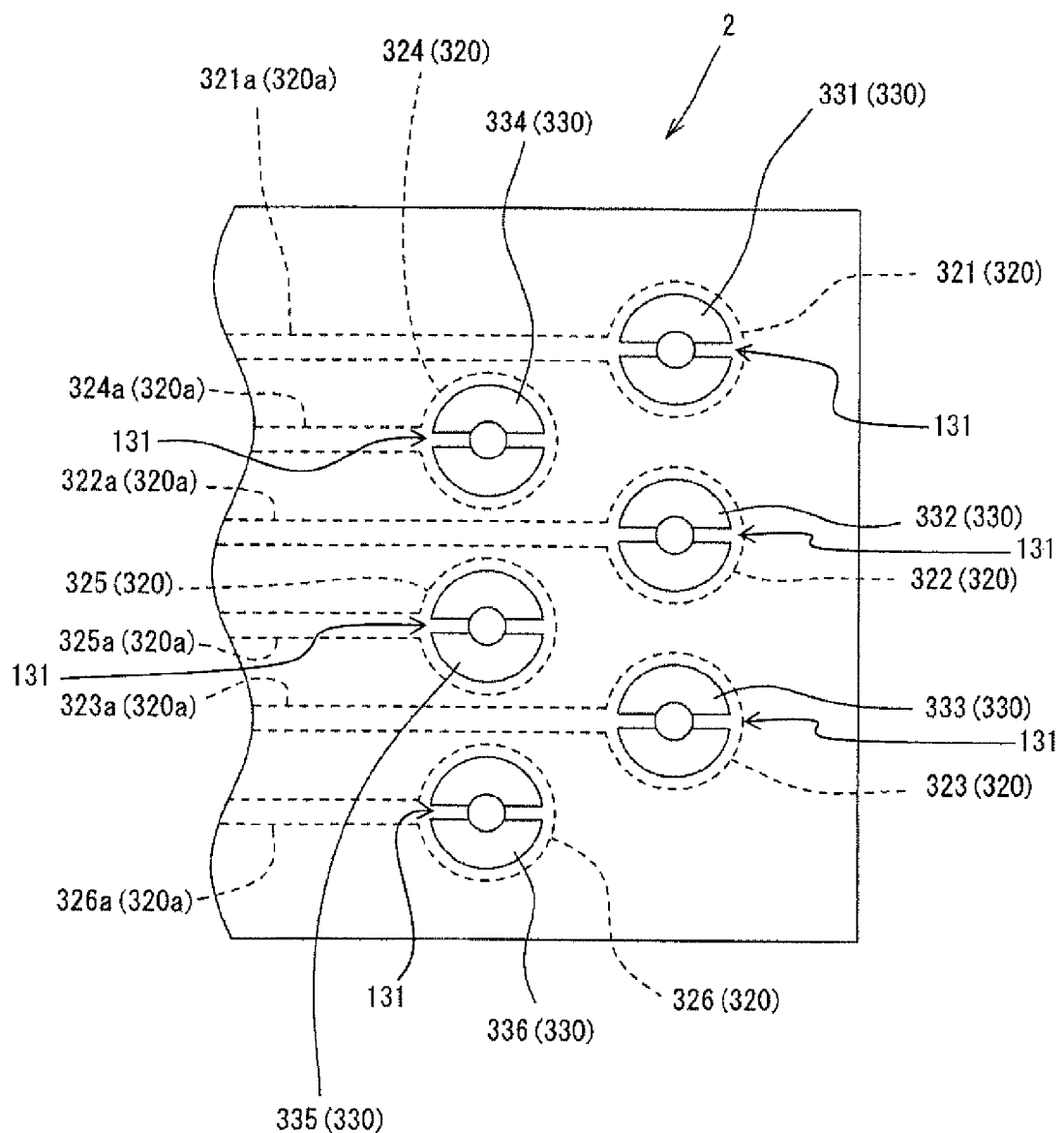
FIG. 5 is a plan view depicting an exemplary flexible printed circuit board, which has lands each corresponding to the land depicted in FIG. 1.

FIG. 5 is a plan view depicting an exemplary flexible printed circuit board 2 having a plurality of welding side lands 120 and a plurality of heating side lands 130, the lands 120 and 130 corresponding to those depicted in FIG. 1. Although, the heating side lands 330 (each of which is numbered with 331, 332, 333, 334, 335, and 336) having grooves, provided on the upper surface of the flexible printed circuit board 2 have the same shape as that of the heating side land 130 in the above embodiment, it is characteristic that the heating side lands 330 are disposed in a zigzag pattern along the width direction of the flexible printed circuit board 2 (the longitudinal direction in FIG. 5). Further, welding side lands 320 (each of which is numbered with 321, 322, 323, 324, 325, and 326), which are conductor patterns and each have a circular shape in plan view, are formed on the lower surface of the flexible printed circuit board 2 at positions corresponding to the heating side lands 330 respectively. That is, the welding side lands 320 are also disposed in the zigzag pattern along the width direction of the flexible printed circuit board 2 in a similar manner to the heating side lands 330.

As clearly depicted in FIG. 5, the heating side lands 330 disposed in the zigzag pattern and thin wire patterns for electrical connection 320*a* corresponding the heating side lands 330 are formed such that the longitudinal direction (extending direction) of the grooves 131 formed in the heating side lands 330 is parallel with the extending direction of the thin wire patterns for electrical connection 320*a*. In the present teaching, it is preferred that adjacent heating side lands 330, among the heating side lands 330 disposed in the zigzag pattern as depicted in FIG. 5, have grooves 131 arranged such that extension lines extending in the longitudinal directions of the grooves 131 do not overlap with each other. The reason thereof is as follows. If the extension lines extending in the longitudinal direction of the grooves 131 of adjacent heating side lands 330 overlap with each other, there is fear that the solder flowing from the outlets of the grooves 131 facing each other might harden, in a space between adjacent heating side lands 330, in a state of sticking together at the time of the melting of solder. This could cause the short circuit in the heating side lands 300.

Thin wire patterns for electrical connection 320*a* (each of which is numbered with 321*a*, 322*a*, 323*a*, 324*a*, 325*a*, and 326*a*) extend from the welding side lands 320 in the extending direction of the flexible printed circuit board 2 (the left-right direction in FIG. 5). Since the welding side lands 320 are disposed in the zigzag pattern, the thin wire patterns for electrical connection 321*a*, 322*a*, and 323*a*, which respectively extend from the welding side lands 321, 322, and 323 disposed on the side of the front end of the flexible printed circuit board 2 (right side in FIG. 5), run close to adjacent welding side lands 320 disposed on the side of the base end of the flexible printed circuit board 2 (the left side in FIG. 5) or run between the welding side lands 324, 325, and 326, without being electrically connected to the welding side lands 324, 325, and 326. This configuration or arrangement of the heat side lands 330, the welding side lands 320 and thin wire patterns for electrical connection 320*a* increases the package density of the flexible printed circuit board 2, and thereby making it possible to reduce the width of the flexible printed circuit board 2 and consequently to downsize the flexible printed circuit board 2.

The above advantages will become clearer through the comparison between the present teaching and the following conventional example. An exemplary flexible printed circuit board related to the conventional example is a flexible printed circuit board having comb-like electrode. This flexible printed circuit board is joined, with soldering via the comb-like electrode, to counterpart electrodes connected to a strain gage.

Each comb tooth of the comb-like electrode in this flexible printed circuit board has a protrusion shape which is thin, long, and narrow. Thus, this flexible printed circuit board related to the conventional example is configured to have lands formed in the comb tooth respectively, and the pitch between adjacent electrodes cannot be reduced unlike the embodiment of the present teaching in which the flexible printed circuit board 2 has the heating side lands 330 and the welding side lands 320 disposed in the zigzag pattern. Therefore, the conventional example still has the problem that the integration degree of the flexible printed circuit board cannot be improved. The flexible printed circuit board 2 related to the present teaching, however, has the above configuration, which makes it possible to improve the integration degree of the flexible printed circuit board and consequently to downsize the flexible printed circuit board while providing the same number of electrodes as the flexible printed circuit board related to the conventional example.

In addition to the above, since each tooth of the comb-like electrode has the protrusion shape which is thin, long, and narrow, each tooth is more likely to be bent or deformed. Thus, the comb-like electrode is required to be carefully handled so that no extra external force is applied on the comb-like electrode at the time of solder joint. The flexible printed circuit board related to the present teaching, however, does not have such a configuration, and thus handling thereof at the time of solder joint is much easier than the conventional example.

Figure 6B:
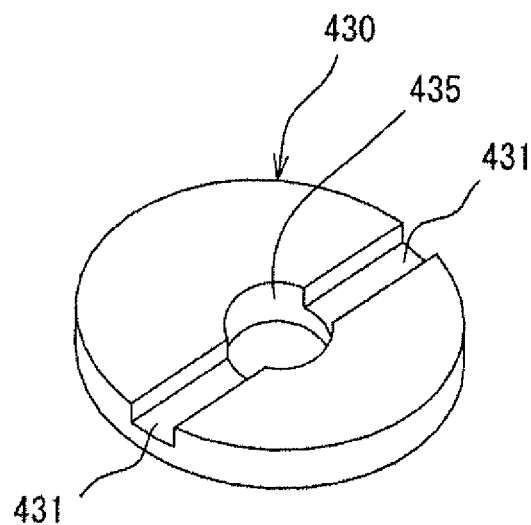
FIG. 6B is a perspective view of the shape of a land related to a modified embodiment of the present teaching.

The present teaching is not limited to the above embodiment, and the action and effect of the present teaching can be also obtained through the following embodiments. For example, it is allowable to employ a heating side land 430 as depicted in FIG. 6B. The heating side land 430 may have a circular or annular shape (doughnut shape) in which a hole 435 is formed in the center to communicate with the through hole 140. A groove (recess) 431 may be formed in the heating side land 430 so that a part of the heating side land 430 is left in its depth direction. When the groove 431 is formed so that the depth of the groove 431 is smaller than the height of the heating side land 430, a communicating hole is provided on the bottom of the groove 431 to let the groove 431 communicate with the through hole 140.

Instead of using the heating side land 130, of the above embodiment, which is formed of two semicircular plates and the groove 131 provided therebetween, a heating side land having only one semicircular plate may be used so that excess solder being melted is allowed to flow to an area excluding the semicircular plate of the heating side land. It is not indispensable to form the groove 131 over the entire area of the circular plate-shaped heating side land 130 in its radial direction, as in the above embodiment. The groove 131 may be formed only in an area which ranges from the upper side opening of the through hole 140 to a point on the outer circumference of the heating side land 130 (an area corresponding to a radius of the circular plate). In this case, the groove 131 may be formed so that the depth thereof reaches the bottom of the heating side land, like the above embodiment, or the groove 131 may be formed so that a part of the heating side land is left in its depth direction, like the modified embodiment.

As another modification, only one protrusion may be formed on the upper surface of the heating side land of the conventional type which has a perfectly circular or annular shape and has the same height in its circumferential direction. Alternatively, protrusions having the same height in its protruding direction may be formed on the upper surface of the heating side land in its circumferential direction.

Further, the height of the heating side land having the circular or annular shape may be periodically changed in its circumferential direction like a sine curve. Alternatively, steps having the same height may be periodically formed on the heating side land having the circular or annular shape in its circumferential direction. That is, the case, in which the heating side land includes a part having the perfectly circular or annular shape (that is, a circular or annular shape of which height (thickness) is constant), may be also included in the scope of the present teaching, provided that the upper surface of the heating side land against which the pulse heater is pressed has different heights, unlike the heating side land related to the conventional example. In other words, any heating side land having a shape or structure by which an air in a through hole can be released to the outside of the heating side land, when a pulse heater is pressed against the heating side land, is included in the scope of the present teaching.

As described above, the recess related to the present teaching includes the groove, which is formed to reach the bottom surface of the heating side land (which is formed to penetrate the upper and bottom surfaces of the heating side land) so that the circular plate-shaped heating side land is divided into two semicircular plates with a small space provided therebetween. Further, for example, when a plurality of cylindrical protrusions having the same height are provided around the upper side opening of the through hole, and each of the protrusions and the welding side land are thermally connected via a wiring extending from each protrusions to the through hole and a rolled copper foil in the through hole, the recess related to the present teaching also includes gaps defined between protrusions. That is, the recess related to the present teaching includes various forms. Further, the heating side land 130 may include a communication hole which connects the through hole 140 and the outer circumferential surface of the heating side land 130. That is, a communication hole penetrating through a side wall of the heating side land 130 may be provided at a position lower than the top of the heating side land 130. In this specification, the "recess" and the "communication hole" described above are collectively called "a channel which connects the through hole and the outside of the heating side land (a first land)".

More specifically, as is clear from the above embodiment in the present description, the present teaching relates to the flexible printed circuit board including, a flexible insulation layer having a first surface and a second surface, a first land which is conductive and which is provided on the first surface of the flexible insulation layer, and a conductive member which is provided on the second surface of the flexible insulation layer, wherein a recess (groove) is formed on the first land. In this flexible printed circuit board, a through hole is formed in the flexible insulation layer, an edge of an opening, of the through hole, defined in the first surface of the flexible insulation layer is in contact with the first land, and the recess fluid-communicates with the through hole and an outer circumferential surface of the first land. The present teaching, however, is not limited to the above embodiment. As is clear from the modified embodiments in the present description, the present teaching also includes the embodiment or aspect in which the recess is provided at a part of the periphery of the opening of the through hole not to include the protrusion constituting a part of the land, the embodiment or aspect in which the protrusion has a substantially semicircular shape in plan view, and the embodiment or aspect in which the protrusions having the same height are formed around the opening of the through hole at a regular interval in the circumferential direction of the opening of the through hole.

In the above embodiment, the counterpart electrode to which the flexible printed circuit board is connected is the electrode of the strain gage. The present teaching, however, is not limited to this. It is needless to say that the electrode of the flexible printed circuit board related to the present teaching can be reliably welded, with soldering, to the counterpart electrode of any electric or electronic part.

Instead of providing the recess (groove) in the heating side land as described above, the following configuration may be adopted. That is, the heating side land may be formed to have the circular or annular shape in which the upper surface thereof has the same height, like the conventional example. In this case, the pulse heater may be provided with the recess (groove), which has a shape similar to the recess (groove) related to the above embodiment or the modified embodiments. In this configuration, melted solder is allowed to flow into the recess (groove) on the side of the pulse heater via the hole in the center of the circular-shaped heating side hand.

According to the embodiments of the present teaching, there can be provided the flexible printed circuit board having the electrode, which is connected or joined to the counterpart electrode via the solder joint with sufficient strength so as to provide satisfactory conductivity for a long time.

What is claimed is:

1. A flexible printed circuit board comprising:
   an insulation layer which has a first surface and a second surface, and in which a through hole connecting the first surface and the second surface is formed;
   a metallic first land provided around an opening, on the first surface of the insulation layer, defined by the through hole;

a metallic second land provided around an opening, on the second surface of the insulation layer, defined by the through hole; and a metallic connecting portion provided in the through hole to connect the metallic first land and the metallic second land, wherein a channel which connects the through hole and an outside of the metallic first land is formed at a position lower than a top of the metallic first land, and the metallic first land is a disk-shaped member which covers the through hole, and the channel is a slit which extends in a radial direction of the disk shaped member and which divides the disk-shaped member into two parts.

2. The flexible printed circuit board according to claim 1, wherein the flexible printed circuit board is a flexible printed circuit board to be soldered to a counterpart electrode with a heater, the top of the metallic first land is a contact surface to which a heating surface of the heater is brought into contact, and in a case that the heating surface of the heater is in contact with the contact surface of the metallic first land, an air in the through hole is released to the outside of the metallic first land through the channel.

3. The flexible printed circuit board according to claim 1, wherein a solder escape portion is provided on a wiring connected to the metallic second land.

4. The flexible printed circuit board according to claim 1, wherein the metallic first land in which the channel is formed includes a plurality of lands disposed in a zigzag pattern.

5. The flexible printed circuit board according to claim 1, wherein the metallic connecting portion is provided on an entire inner circumferential surface of the through hole.

6. A flexible printed circuit board comprising:
an insulation layer which has a first surface and a second surface, and in which a through hole connecting the first surface and the second surface is formed;
a metallic first land provided around an opening, on the first surface of the insulation layer, defined by the through hole;
a metallic second land provided around an opening, on the second surface of the insulation layer, defined by the through hole; and
a metallic connecting portion provided in the through hole to connect the metallic first land and the metallic second land, wherein a channel which connects the through hole and an outside of the metallic first land is formed at a position lower than a top of the metallic first land, and the flexible printed circuit board is a flexible printed circuit board to be soldered to a counterpart electrode with a heater, the top of the metallic first land is a contact surface to which a heating surface of the heater is brought into contact, and in a case that the heating surface of the heater is in contact with the contact surface of the metallic first land, an air in the through hole is released to the outside of the metallic first land through the channel.

7. The flexible printed circuit board according to claim 6, wherein the metallic connecting portion is provided on an entire inner circumferential surface of the through hole.

8. The flexible printed circuit board according to claim 6, wherein a solder escape portion is provided on a wiring connected to the metallic second land.

9. A flexible printed circuit board comprising:
an insulation layer which has a first surface and a second surface, and in which a through hole connecting the first surface and the second surface is formed;
a metallic first land provided around an opening, on the first surface of the insulation layer, defined by the through hole;
a metallic second land provided around an opening, on the second surface of the insulation layer, defined by the through hole; and
a metallic connecting portion provided in the through hole to connect the metallic first land and the metallic second land, wherein a channel which connects the through hole and an outside of the metallic first land is formed at a position lower than a top of the metallic first land, the metallic first land in which the channel is formed includes a plurality of lands disposed in a zigzag pattern, the channels of the lands are formed as grooves, and two lines respectively extending along longitudinal directions of the grooves of two adjacent lands do not overlap with each other.

10. The flexible printed circuit board according to claim 9, wherein the metallic connecting portion is provided on an entire inner circumferential surface of the through hole.

11. The flexible printed circuit board according to claim 9, wherein a solder escape portion is provided on a wiring connected to the metallic second land.

* * * * *